(12) United States Patent
Tan et al.

(10) Patent No.: US 9,991,128 B2
(45) Date of Patent: *Jun. 5, 2018

(54) ATOMIC LAYER ETCHING IN CONTINUOUS PLASMA

(71) Applicant: Lam Research Corporation, Fremont, CA (US)

(72) Inventors: Zhongkui Tan, San Jose, CA (US); Yiting Zhang, Fremont, CA (US); Ying Wu, Dublin, CA (US); Qing Xu, Fremont, CA (US); Qian Fu, Pleasanton, CA (US); Yoko Yamaguchi, Union City, CA (US); Lin Cui, Dublin, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/421,189

(22) Filed: Jan. 31, 2017

(65) Prior Publication Data

US 2017/0229311 A1  Aug. 10, 2017

Related U.S. Application Data

(60) Provisional application No. 62/322,135, filed on Apr. 13, 2016, provisional application No. 62/292,115, filed on Feb. 5, 2016.

(51) Int. Cl.
*H01L 21/3065* (2006.01)
*H01L 21/67* (2006.01)
(Continued)

(52) U.S. Cl.
CPC .... *H01L 21/3065* (2013.01); *C23C 16/45536* (2013.01); *C23C 16/45544* (2013.01);
(Continued)

(58) Field of Classification Search
None
See application file for complete search history.

(56) References Cited

U.S. PATENT DOCUMENTS

| 4,592,801 A | 6/1986 | Hara et al. |
| 4,756,794 A | 7/1988 | Yoder |

(Continued)

FOREIGN PATENT DOCUMENTS

| CN | 1550575 A | 12/2004 |
| CN | 1552097 A | 12/2004 |

(Continued)

OTHER PUBLICATIONS

U.S. Office Action dated Jul. 21, 2015 issued in U.S. Appl. No. 14/446,203.

(Continued)

*Primary Examiner* — Shamim Ahmed
(74) *Attorney, Agent, or Firm* — Weaver Austin Villeneuve & Sampson, LLP

(57) ABSTRACT

Methods and apparatus for etching substrates using self-limiting reactions based on removal energy thresholds determined by evaluating the material to be etched and the chemistries used to etch the material involve flow of continuous plasma. Process conditions permit controlled, self-limiting anisotropic etching without alternating between chemistries used to etch material on a substrate. A well-controlled etch front allows a synergistic effect of reactive radicals and inert ions to perform the etching, such that material is etched when the substrate is modified by reactive radicals and removed by inert ions, but not etched when material is modified by reactive radicals but no inert ions are present, or when inert ions are present but material is not modified by reactive radicals.

19 Claims, 6 Drawing Sheets

(51) Int. Cl.

| | | |
|---|---|---|
| *H01J 37/32* | (2006.01) | |
| *C23C 16/52* | (2006.01) | |
| *H01L 21/311* | (2006.01) | |
| *C23C 16/455* | (2006.01) | |
| *H01L 21/308* | (2006.01) | |
| *H01L 21/3213* | (2006.01) | |
| *H01L 21/683* | (2006.01) | |

(52) U.S. Cl.
CPC ........ *C23C 16/52* (2013.01); *H01J 37/32082* (2013.01); *H01J 37/32119* (2013.01); *H01J 37/32183* (2013.01); *H01J 37/32449* (2013.01); *H01J 37/32697* (2013.01); *H01J 37/32715* (2013.01); *H01J 37/32926* (2013.01); *H01L 21/3085* (2013.01); *H01L 21/31122* (2013.01); *H01L 21/31144* (2013.01); *H01L 21/32136* (2013.01); *H01L 21/32139* (2013.01); *H01L 21/67069* (2013.01); *H01L 21/6833* (2013.01); *H01J 2237/332* (2013.01); *H01J 2237/334* (2013.01)

(56) References Cited

U.S. PATENT DOCUMENTS

| | | |
|---|---|---|
| 5,482,802 A | 1/1996 | Celler et al. |
| 5,501,893 A | 3/1996 | Laermer et al. |
| 5,527,425 A | 6/1996 | Hobson et al. |
| 5,789,265 A | 8/1998 | Nitta et al. |
| 5,814,239 A | 9/1998 | Kaneko et al. |
| 6,022,806 A | 2/2000 | Sato et al. |
| 6,177,353 B1 | 1/2001 | Gutsche et al. |
| 6,448,192 B1 | 9/2002 | Kaushik |
| 6,482,745 B1 | 11/2002 | Hwang |
| 6,635,965 B1 | 10/2003 | Lee et al. |
| 6,844,258 B1 | 1/2005 | Fair et al. |
| 6,933,242 B1 | 8/2005 | Srinivasan et al. |
| 7,005,372 B2 | 2/2006 | Levy et al. |
| 7,141,494 B2 | 11/2006 | Lee et al. |
| 7,196,955 B2 | 3/2007 | Nickel |
| 7,416,989 B1* | 8/2008 | Liu .................. H01L 21/02063 438/706 |
| 7,589,017 B2 | 9/2009 | Chan et al. |
| 7,772,114 B2 | 8/2010 | Chan et al. |
| 7,795,148 B2 | 9/2010 | Brown |
| 7,955,972 B2 | 6/2011 | Chan et al. |
| 8,048,805 B2 | 11/2011 | Chan et al. |
| 8,058,170 B2 | 11/2011 | Chandrashekar et al. |
| 8,124,505 B1 | 2/2012 | Burnham et al. |
| 8,124,531 B2 | 2/2012 | Chandrashekar et al. |
| 8,252,194 B2 | 8/2012 | Kiehlbauch et al. |
| 8,551,885 B2 | 10/2013 | Chan et al. |
| 8,808,561 B2 | 8/2014 | Kanarik |
| 8,883,028 B2 | 11/2014 | Kanarik |
| 8,993,352 B2 | 3/2015 | Nishimura et al. |
| 9,130,158 B1 | 9/2015 | Shen et al. |
| 9,230,818 B2 | 1/2016 | Moustakas et al. |
| 9,257,638 B2 | 2/2016 | Tan et al. |
| 9,362,163 B2 | 6/2016 | Danek et al. |
| 9,378,970 B2 | 6/2016 | Joubert et al. |
| 9,449,843 B1 | 9/2016 | Korolik et al. |
| 9,570,317 B2 | 2/2017 | Posseme et al. |
| 9,570,600 B2 | 2/2017 | Lu et al. |
| 9,576,811 B2 | 2/2017 | Kanarik et al. |
| 9,675,811 B2 | 6/2017 | Stahmann et al. |
| 9,805,941 B2 | 10/2017 | Kanarik et al. |
| 9,806,252 B2* | 10/2017 | Tan ...................... H01L 27/222 |
| 9,837,312 B1 | 12/2017 | Tan et al. |
| 9,870,899 B2 | 1/2018 | Yang et al. |
| 2001/0053585 A1 | 12/2001 | Kikuchi et al. |
| 2002/0009883 A1 | 1/2002 | Ogure et al. |
| 2002/0058409 A1 | 5/2002 | Lin et al. |
| 2002/0081381 A1 | 6/2002 | DelaRosa et al. |
| 2003/0015704 A1 | 1/2003 | Curless |
| 2004/0004056 A1 | 1/2004 | Sasaki et al. |
| 2004/0137749 A1 | 7/2004 | Ying et al. |
| 2004/0209476 A1 | 10/2004 | Ying et al. |
| 2005/0006222 A1 | 1/2005 | Ding et al. |
| 2005/0098440 A1 | 5/2005 | Kailasam et al. |
| 2006/0009040 A1 | 1/2006 | Tomioka et al. |
| 2006/0051959 A1 | 3/2006 | Iwatake et al. |
| 2006/0194435 A1 | 8/2006 | Nishimura et al. |
| 2007/0049036 A1 | 3/2007 | Huang |
| 2007/0202254 A1 | 8/2007 | Ganguli et al. |
| 2007/0238301 A1 | 10/2007 | Cabral et al. |
| 2007/0246442 A1 | 10/2007 | America et al. |
| 2009/0020884 A1 | 1/2009 | Lee et al. |
| 2009/0075472 A1 | 3/2009 | Arnold et al. |
| 2009/0226611 A1 | 9/2009 | Suzuki et al. |
| 2009/0236693 A1 | 9/2009 | Moustakas et al. |
| 2009/0256220 A1 | 10/2009 | Horng et al. |
| 2009/0289263 A1 | 11/2009 | Duong et al. |
| 2010/0291751 A1 | 11/2010 | Lee et al. |
| 2011/0139748 A1 | 6/2011 | Donnelly et al. |
| 2011/0151635 A1 | 6/2011 | Liu et al. |
| 2011/0192820 A1 | 8/2011 | Yeom et al. |
| 2011/0212274 A1 | 9/2011 | Selsley |
| 2012/0009785 A1 | 1/2012 | Chandrashekar et al. |
| 2012/0115329 A1 | 5/2012 | Chandrashekar et al. |
| 2012/0276657 A1 | 11/2012 | Joubert et al. |
| 2013/0099277 A1 | 4/2013 | Speck et al. |
| 2013/0105303 A1 | 5/2013 | Lubomirsky et al. |
| 2013/0168354 A1 | 7/2013 | Kanarik |
| 2013/0200391 A1 | 8/2013 | Bedair et al. |
| 2013/0313561 A1 | 11/2013 | Suh |
| 2014/0061861 A1 | 3/2014 | Moustakas et al. |
| 2014/0134847 A1 | 5/2014 | Seya |
| 2014/0170853 A1 | 6/2014 | Shamma et al. |
| 2014/0335666 A1 | 11/2014 | Koehler et al. |
| 2015/0037972 A1* | 2/2015 | Danek .................. C23G 5/00 438/643 |
| 2015/0214474 A1 | 7/2015 | Nishimura et al. |
| 2015/0228495 A1 | 8/2015 | Joubert et al. |
| 2015/0270140 A1* | 9/2015 | Gupta ............... H01L 21/32136 216/67 |
| 2016/0013063 A1 | 1/2016 | Ranjan et al. |
| 2016/0020152 A1 | 1/2016 | Posseme |
| 2016/0064244 A1 | 3/2016 | Agarwal et al. |
| 2016/0203995 A1 | 7/2016 | Kanarik et al. |
| 2016/0293437 A1 | 10/2016 | Zhou et al. |
| 2016/0308112 A1 | 10/2016 | Tan et al. |
| 2016/0314985 A1 | 10/2016 | Yang et al. |
| 2016/0358782 A1 | 12/2016 | Yang et al. |
| 2017/0040214 A1 | 2/2017 | Lai et al. |
| 2017/0053810 A1 | 2/2017 | Yang et al. |
| 2017/0069462 A1 | 3/2017 | Kanarik et al. |
| 2017/0084822 A1 | 3/2017 | Kim et al. |
| 2017/0117159 A1 | 4/2017 | Kanarik et al. |
| 2017/0125256 A1 | 5/2017 | Lee et al. |
| 2017/0316935 A1 | 11/2017 | Tan et al. |
| 2018/0019387 A1 | 1/2018 | Tan et al. |
| 2018/0033635 A1 | 2/2018 | Kanarik et al. |

FOREIGN PATENT DOCUMENTS

| | | |
|---|---|---|
| JP | 06-326060 A | 11/1994 |
| JP | 5416280 B2 | 11/2013 |
| WO | WO 02/091461 A2 | 11/2002 |
| WO | WO 2011/081921 A2 | 7/2011 |
| WO | WO 2012/091461 A2 | 7/2012 |
| WO | WO 2016/100873 | 6/2016 |

OTHER PUBLICATIONS

U.S. Notice of Allowance dated Feb. 5, 2016 issued in U.S. Appl. No. 14/446,203.
U.S. Office Action dated May 5, 2016 issued in U.S. Appl. No. 14/749,285.
U.S. Final Office Action dated Sep. 23, 2016 issued in U.S. Appl. No. 14/749,285.
U.S. Office Action dated Feb. 17, 2017 issued in U.S. Appl. No. 14/749,285.

(56) References Cited

OTHER PUBLICATIONS

U.S. Final Office Action dated Mar. 30, 2017 issued in U.S. Appl. No. 14/749,285.
U.S. Office Action dated Nov. 28, 2016 issued in U.S. Appl. No. 14/749,291.
U.S. Notice of Allowance dated Jun. 30, 2017 issued in U.S. Appl. No. 14/749,291.
U.S. Office Action dated Jul. 1, 2016 issued in U.S. Appl. No. 14/830,683.
U.S. Final Office Action dated Feb. 7, 2017 issued in U.S. Appl. No. 14/830,683.
U.S. Office Action dated May 23, 2017 issued in U.S. Appl. No. 15/173,358.
Carver et al. (Feb. 20, 2015) "Atomic Layer Etching: An Industry Perspective," *ECS Journal of Solid State Science and Technology*, 4(6):N5005-N5009.
DeSalvo, G. et al., (1996) "Controlled Digital Etching of GaAs for Precise Gate Recess Formation in MESFET, HEMT and pHEMT Device Fabrication," [http://csmantech.pairserver.com/newsite/gaasmantech/Digests/1996/papers/1996%202.2%20controlled%20digital%20etching%20gaas.pdf], pp. 29-31.
Higham, Eric, (2016) "The Compound Semiconductor Industry; How Did It Get Here and Where Is It Going?," *SemiCon WEST* Jul. 12-14, 2016 [http://www.semiconwest.org/sites/semiconwest.org/files/data15/docs/2_Eric%20Higham_Strategy%20Analytics.pdf], 27pp.
Kanarik et al. (2017) "Predicting synergy in atomic layer etching," *J. Vac. Sci. Technol. A*, 35(5):05C302-1 through 05C302-7.
Kanarik et al. (Mar./Apr. 2015) "Overview of atomic layer etching in the semiconductor industry," *J. Vac. Sci. Technol. A*, 33(2):020802-1-020802-14.
Kim, Jong Kyu, et al., (Nov./Dec. 2013) "Atomic layer etching removal of damaged layers in a contact hole for low sheet resistance," *Journal of Vacuum Science & Technology*, 31(6):8.
Lee et al. (2015) "Atomic Layer Etching of $Al_2O_3$ Using Sequential, Self-Limiting Thermal Reactions with $Sn(acac)_2$ and Hydrogen Fluoride," *ACSNANO*, 9(2):2061-2070.
Metzler et al., (Mar./Apr. 2014) "Fluorocarbon assisted atomic layer etching of SiO2 using cyclic Ar/C4F8 plasma," *Journal of Vacuum Science & Technology A*, 32(2):5.
Oehrlein, Gottlieb S., "Atomic Layer Etching of $SiO_2$: Challenges and Opportunities*," *University of Maryland, Atomic Layer Etch and Atomic Layer Clean Technology Workshop*, San Francisco, Apr. 21, 2014, 22 pages.
Wolf, S. and Tauber, R.N. (1986) "Silicon Processing for the VLSI Era," *Volume 1—Process Technology*, Lattice Press, pp. 542-557.
U.S. Appl. No. 15/286,421, filed Oct. 5, 2016, Tan et al.
U.S. Appl. No. 15/494,245, filed Apr. 21, 2017, Tan et al.
U.S. Appl. No. 15/582,359, filed Apr. 28, 2017, Agarwal et al.
U.S. Office Action dated Mar. 24, 2017 issued in U.S. Appl. No. 15/286,421.
U.S. Notice of Allowance [Supplemental Notice of Allowability] dated Dec. 11, 2017 issued in U.S. Appl. No. 14/749,285.
U.S. Notice of Allowance [Supplemental Notice of Allowability] dated Oct. 26, 2017 issued in U.S. Appl. No. 15/286,421.
U.S. Notice of Allowance dated Jan. 11, 2018 issued in U.S. Appl. No. 14/830,683.
U.S. Notice of Allowance dated Jan. 29, 2018 issued in U.S. Appl. No. 15/173,358.
U.S. Notice of Allowance dated Jun. 29, 2017 issued in U.S. Appl. No. 15/400,368.
U.S. Notice of Allowance dated Oct. 14, 2016 issued in U.S. Appl. No. 14/696,254.
U.S. Notice of Allowance dated Sep. 28, 2017 issued in U.S. Appl. No. 15/286,421.
U.S. Notice of Allowance dated Sep. 29, 2017 issued in U.S. Appl. No. 14/749,285.
U.S. Office Action dated Aug. 11, 2017 issued in U.S. Appl. No. 14/749,285.
U.S. Office Action dated Aug. 25, 2017 issued in U.S. Appl. No. 15/239,138.
U.S. Office Action dated Jul. 25, 2017 issued in U.S. Appl. No. 14/830,683.
U.S. Office Action dated Jun. 17, 2016 issued in U.S. Appl. No. 14/696,254.
Chinese First Office Action dated Dec. 27, 2017 issued in CN 201610017911.4.
PCT International Search Report and Written Opinion dated Feb. 25, 2016 issued in PCT/US2015/066789.
Taiwanese First Office Action dated Oct. 24, 2017 issued in TW 103126076.
Faraz et al., (Mar. 24, 2015) "Atomic Layer Etching: What Can We Learn from Atomic Layer Deposition?," *ECS Journal of Solid State Science and Technology*, 4(6):N5023-N5032.
Volatier, M., et al., "Extremely high aspect ratio GaAs and GaAs/AlGaAs nanowaveguides fabricated using chlorine ICP etching with N2-promoted passivation," Nanotechnology, vol. 21, Mar. 8, 2010, pp. 1-8. <doi: 10.1088/0957-4484/21/13/134014>.
U.S. Appl. No. 15/654,612, filed Jul. 19, 2017, Agarwal et al.
U.S. Appl. No. 15/824,987, filed Nov. 28, 2017, Yang et al.
U.S. Appl. No. 15/841,205, filed Dec. 13, 2017, Kanarik.
U.S. Notice of Allowance dated Oct. 6, 2017 issued in U.S. Appl. No. 15/582,359.
U.S. Notice of Allowance dated Jan. 26, 2018 issued in U.S. Appl. No. 15/582,359.
U.S. Office Action dated Mar. 29, 2018 issued in U.S. Appl. No. 15/719,484.
U.S. Office Action dated Apr. 19, 2018 issued in U.S. Appl. No. 15/494,245.
Chinese First Office Action dated Mar. 30, 2018 issued in CN 201610248296.8.
International Search Report and Written Opinion dated Apr. 5, 2018 issued in PCT/US2017/066470.
U.S. Appl. No. 15/955,099, filed Apr. 17, 2018, LaVoie et al.

* cited by examiner

ATOMIC LAYER ETCHING IN CONTINUOUS PLASMA

CROSS-REFERENCE TO RELATED APPLICATION

This application claims benefit of U.S. Provisional Patent Application No. 62/322,135, filed Apr. 13, 2016, and titled "ATOMIC LAYER ETCHING IN CONTINUOUS PLASMA," and U.S. Provisional Patent Application No. 62/292,115, filed Feb. 5, 2016, and titled "ATOMIC LAYER ETCHING IN CONTINUOUS PLASMA," which are incorporated by reference herein in their entireties and for all purposes.

BACKGROUND

Plasma etch in atomic scale has been studied for many years. Conventional plasma etch processes are often performed at a high etch rate using reactive ions and reactive chemistry, but due to the reactivity of the plasma, the etching process often results in undesired etch of layers under the material to be etched.

SUMMARY

Provided herein are methods and apparatus for etching substrates using self-limiting reactions based on removal energy thresholds determined by evaluating the material to be etched and the chemistries used to etch the material. Embodiments involve flow of continuous plasma at process conditions to permit controlled, self-limiting anisotropic etching without alternating between chemistries used to etch material on a substrate. According to disclosed embodiments, a well-controlled etch front allows a synergistic effect of reactive radicals and inert ions to perform the etching, such that material is etched when the substrate is modified by reactive radicals and removed by inert ions, but not etched when material is modified by reactive radicals but no inert ions are present, or when inert ions are present but material is not modified by reactive radicals.

In one aspect, the disclosure relates to a method of etching a material of a substrate. The method involves exposing a substrate in a processing chamber to both a plasma generated by a reactive species and a plasma generated by an inert ion gas to remove the material using self-limiting reactions, wherein the energy threshold for removing a layer of the material modified by the reactive species using the inert ion gas is less than the energy threshold for sputtering the material on the substrate using the inert ion gas. According to various embodiments, exposure of the substrate to the reactive species modifies the exposed substrate material, and the inert ions generated by the plasma remove the modified substrate material, thereby etching the substrate material. According to various embodiments, during the exposure of the substrate to the reactive species and inert ions, the plasma is delivered continuously such that both source power and bias power are continuously on during the etch. And, according to various embodiments, the concentration of inert gases present in the processing chamber during the etch is greater than 99% of all chemical species in the chamber, while the concentration of reactive species is less than about 1%.

In another aspect, the disclosure provides an apparatus for etching a material of a substrate, the apparatus having a controller to affect a method of etching the material of the substrate in a processing chamber of the apparatus as described herein.

These and other aspects are described further below with reference to the drawings.

DETAILED DESCRIPTION

Figure 1:
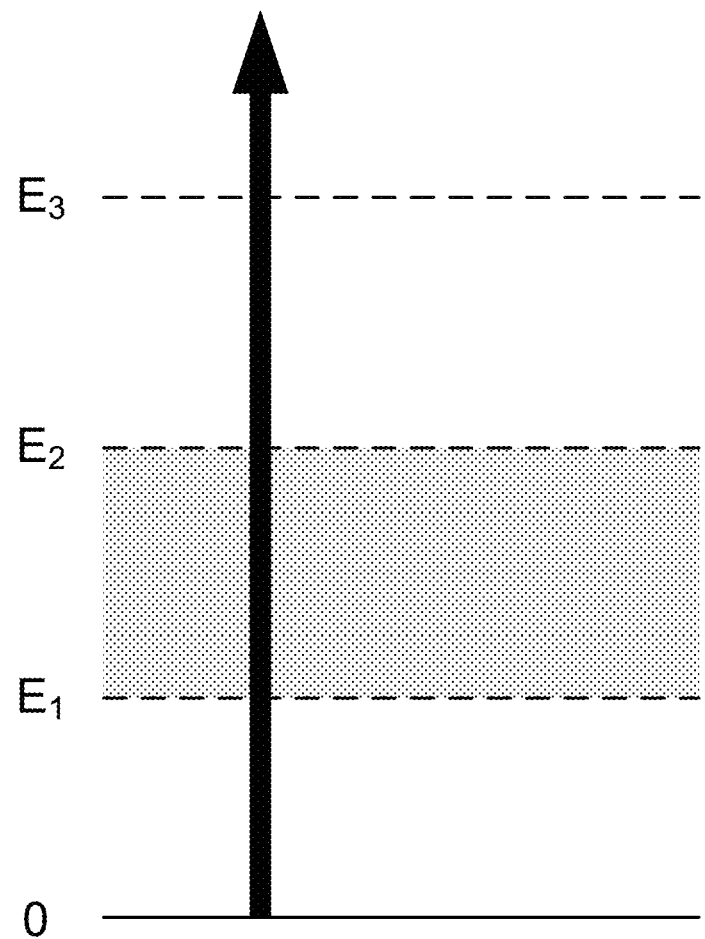
FIG. 1 shows an energy diagram depicting energy thresholds relevant to a discussion of atomic layer etching according to this disclosure.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Atomic layer etching (ALE) is one approach for atomic scale control of etching behavior. ALE is a technique for removing thin layers of materials using sequential reaction steps that are self-limiting. This may be done by a surface modification operation (i.e. chemisorption by radical reaction of reactive chemistry on a substrate surface) followed by a removal operation (i.e. ion assisted etching using inert, non-reactive ions). Such operations may be repeated for a certain number of cycles. During ALE, the reactive chemistry and the inert ions are delivered separately to the substrate.

ALE has many advantages over traditional plasma etching for at least some etch applications. For example, ALE may be suitable for performing anisotropic etching, and may result in improved through-pitch loading and aspect ratio dependence etching. ALE also generally results in less damage to the material to be etched and improved selectivity to a mask material overlying the material to be etched.

However, ALE is usually slower than conventional plasma etching because very thin layers are etched in each ALE cycle and each cycle relies on a saturation curve wait time such that the modification chemistry has sufficient time to substantially saturate the surface of the material to be etched. Saturation is also used during the removal operation, thus resulting in an extended process time. In addition, chemistries used in the surface modification operation are different from chemistries used in the removal operation, which, when performing ALE in alternating pulses of modification chemistry and removal chemistry, increases the time used to switch between chemistry flows to a chamber. Chemistries are also often purged between pulses during each cycle to ensure a self-limiting reaction is performed in each cycle. The slower etch rate and process control difficulty with multiple gas changes in one cycle can limit the use of ALE in semiconductor fabrication. ALE is also often performed using simpler chemistry to reduce the likelihood of chemistry buildup on the substrate to be etched. For example, more complex molecules may not be suitable for use with ALE because such molecules may build up on the surface of the material to be etched and will not completely saturate the surface to perform a self-limiting etch process.

Disclosed methods of etching substrates use self-limiting reactions based on removal energy thresholds determined by evaluating the material to be etched and the chemistries used to etch the material. Embodiments involve flow of continuous plasma at process conditions to permit controlled, self-limiting anisotropic etching without alternating between chemistries used to etch material on a substrate.

Disclosed embodiments performed using continuous plasma combine the benefits of both ALE and regular continuous plasma etching. Plasma generated in disclosed embodiments includes reactive species (e.g., radicals or molecules) and inert ions as etchants, while maintaining a low reactive ion density such that any etching effect of reactive ions is negligible. As described herein, inert ions refer to ions of gases such as helium or argon that have sufficient energy to remove modified material on the surface of the substrate but are not reactive enough to etch unmodified material itself. Additionally, reactive ion density refers to the density of ions, such as oxygen or chlorine ions, that are reactive such that they may etch the material on the substrate. In contrast, reactive species, reactive radicals or reactive chemistry as described herein may refer to the plasma species without charge used to react with the material on the surface of the substrate to modify the surface of the substrate.

In some embodiments, the concentration of inert gases present in the chamber may be greater than about 99% of all chemical species in the chamber, while the concentration of reactive species (e.g., modification chemistry) may be less than about 1%. In some embodiments, high pressure plasma generates enough radical density of the reactive species even with their low concentration to modify the substrate, while maintaining an extremely low concentration of reactive ions at the substrate, due to the low concentration and shorter mean-free-path in high pressure, thereby maintaining a high chemisorption rate and an etch rate faster than that of ALE.

In various embodiments, a low bias power (e.g., about 50 Vb) may be applied during the etch process. In some embodiments, the bias power is pulsed, such as between 0 Vb and about 50 Vb. It will be understood that the terms "bias power" and "bias voltage" are used interchangeably herein to describe the voltage for which a pedestal is set when a bias is applied to the pedestal. A threshold bias power or threshold bias voltage refers to the maximum voltage of the bias applied to a pedestal before material on the surface of a substrate on the pedestal is sputtered. The threshold bias power therefore depends in part on the material to be etched, the gas used to generate plasma, plasma power for igniting the plasma, and plasma frequency. Bias power or bias voltage as described herein is measured in volts, which are indicated by the unit "V" or "Vb", where b refers to bias.

According to disclosed embodiments, a well-controlled etch front allows a synergistic effect of reactive radicals and inert ions to perform the etching, such that material is etched when the substrate is modified by reactive radicals and removed by inert ions, but not etched when material is modified by reactive radicals but no inert ions are present, or when inert ions are present but material is not modified by reactive radicals. Disclosed embodiments reduce damage to the substrate from ions and plasma, while maintaining high etch selectivity and smooth etch profiles. In various embodiments, the sidewalls of features to be etched may not need to be passivated because process conditions are controlled by varying chamber pressure, concentration of inert ions, concentration of reactive species, plasma power, plasma frequency, temperature, and exposure time such that there is little or no lateral etching or undercutting. Disclosed embodiments also reduce loading effects or microloading because process conditions are controlled to maintain self-limiting reactions at the surface of the substrate. Although there may be some loading effects due to the process involving continuous etching and diffusion rates of the reactive species and the inert ions in features of various sizes, the etching process may be controlled by pulsing the bias and controlling the duration of exposure to balance the etch rate between larger and smaller critical dimension features.

FIG. 1 shows an energy diagram depicting energy thresholds $E_1$, $E_2$, and $E_3$ relevant to a discussion of atomic layer etching according to this disclosure. Etch chemistries and process conditions for performing disclosed embodiments are selected based on three energy thresholds: (1) $E_1$, the energy threshold needed to remove a modified material from the surface of the material, (2) $E_2$, the energy threshold upon which inert ions have sufficient energy to bombard or sputter onto the surface of the material to be etched (or material underlying the material to be etched), thereby resulting in physical removal of material on the substrate; and optionally (3) $E_3$, the energy threshold upon which inert ions have sufficient energy to bombard or sputter onto the surface of a mask layer over the target layer, thereby resulting in physical removal of mask material. FIG. 1 is an energy diagram depicting the region (between $E_1$ and $E_2$) within which disclosed embodiments are capable of being performed to utilize the benefits of self-limiting etching while reducing damage to the substrate and maintaining etch selectivity.

Process conditions and etch chemistries are selected such that $E_1$ is less than $E_2$, and if the material to be etched is under a patterned mask (as opposed to material to be etched being a blanket layer), process conditions and etch chemistries are also selected such that E1 is less than both E2 and E3. Such energy thresholds are selected to ensure that inert ions have sufficient energy to remove modified material from the surface (energy must be greater than $E_1$), but that inert ions do not sputter the surface of the material to be etched (energy must be less than $E_2$), and, in the case of etching to pattern a substrate, that inert ions do not sputter or cause damage to the mask (energy must be less than $E_3$).

Disclosed embodiments can also be applied to many different and complicated etching chemistries, if there is no spontaneous etching using the chemistries selected and the above energy thresholds are maintained.

In some embodiments, a relatively high pressure plasma is used. The pressure of the chamber may be between about 30 mTorr and about 1000 mTorr, for example about 100 to 500 mTorr or about 200 to 300 mTorr. This high pressure plasma includes a high concentration of inert species (for example, He, Ne, Ar, Kr, Xe, or combinations thereof) and low concentration of reactive species (for example, F-containing, Cl-containing, Br-containing, O-containing species.). Inert gases typically generate more ions than other molecular gases in a standard plasma condition. In addition, a high concentration of inert species can ensure the majority of ions (e.g., >99%) are non-reactive, and the reactive ion density is negligible.

While in high pressure plasma, the radicals or chemically reactive molecules from reactive species are still enough for a sufficient chemisorption on the target material. The chemistry is selected to have chemisorption on the surface, but not enough reactivity for spontaneous etching without ion assistance. Ion energy (of inert species) is set at a value to be high enough to activate the surface after absorption of the chemically reactive species, but not enough for physical sputtering, similar to that of cyclic ALE. Plasma is delivered continuously such that both source power and bias power are continuously on. Etching is self-limiting because etching happens when the inert ions meet the chemisorbed, modified layer at the same site. Process conditions are selected such that inert ions or chemisorbed modified material on the surface alone is insufficient to etch the material. In various embodiments, etching is performed anisotropically. Anisotropic etch may be achieved due to the directionality of inert ions delivered to a substrate with a bias. In various embodiments, etching is also selective.

Figure 2A:
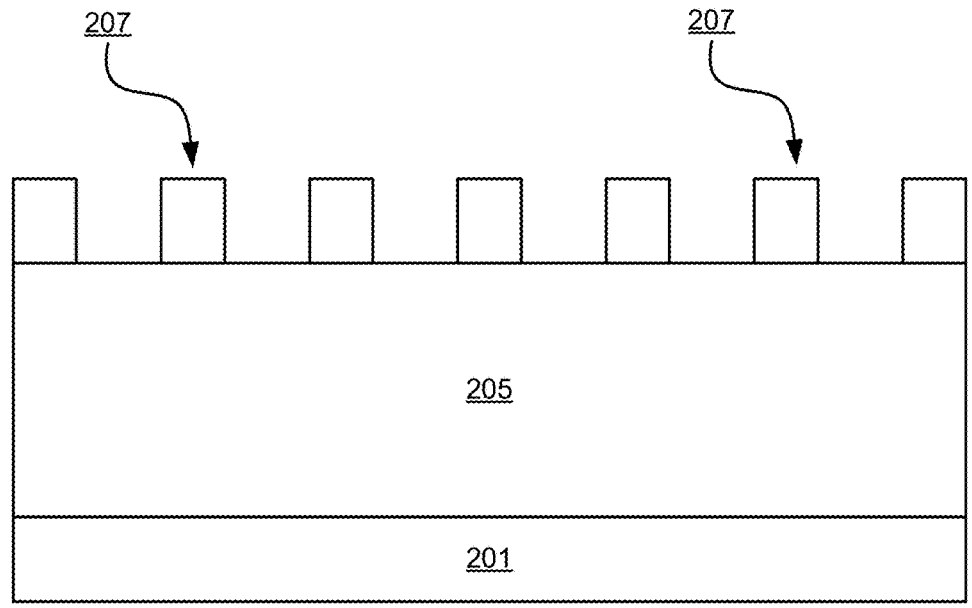
FIGS. 2A-B are schematic illustrations of a substrate undergoing operations of certain disclosed embodiments.
Figure 2B:
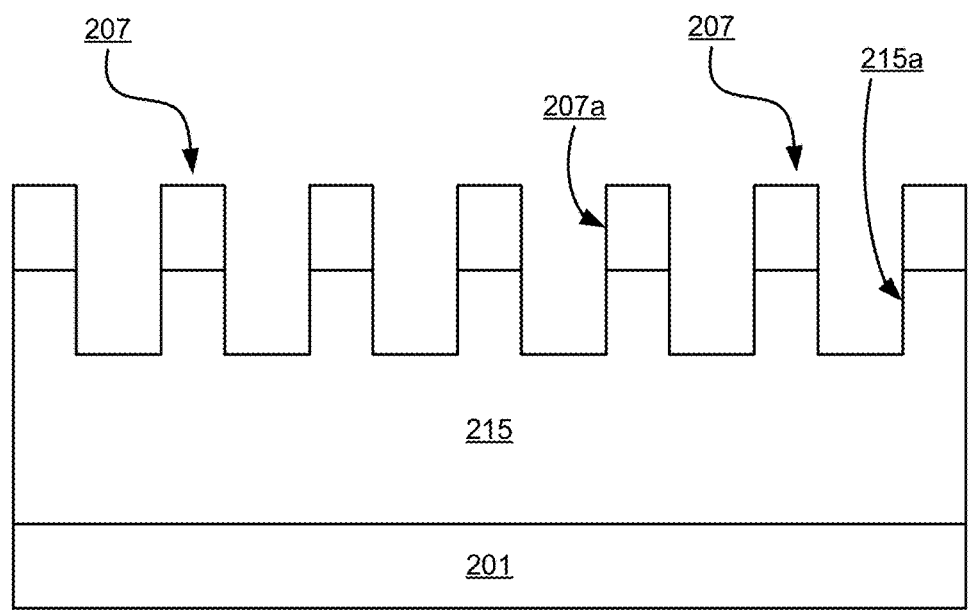

FIGS. 2A-B provide an example schematic illustration of a substrate having features undergoing various operations in accordance with disclosed embodiments. FIG. 2 shows a substrate including an underlayer 201 and a target material layer 205 to be etched with an overlaying mask 207. A continuous plasma is flowed, exposing the substrate to both a plasma of reactive species selected to modify the target material and a plasma of inert ions to remove the modified material in self-limiting reactions. The energy threshold for removing a layer of the material modified by the reactive species using the inert ions is less than the energy threshold for sputtering the material on the substrate using the inert ions. The energy threshold for removing a layer of the material modified by the reactive species using the inert ions is also less than the energy threshold upon which inert ions have sufficient energy to bombard or sputter onto the surface of a mask layer over the target layer, thereby resulting in physical removal of mask material.

A well-controlled etch front allows a synergistic effect of reactive radicals and inert ions to perform the etching, such that material is etched when the substrate is modified by reactive radicals and removed by inert ions, but not etched when material is modified by reactive radicals but no inert ions are present, or when inert ions are present but material is not modified by reactive radicals. The process permits controlled, self-limiting anisotropic etching without alternating between chemistries used to etch material on a substrate. The resulting substrate is depicted in FIG. 2B. Note that the mask 207 maintained a good profile without mask loss such that the sidewalls 207a of the mask 207 are still vertical. Additionally, the etched target layer 215 has substantially vertical sidewalls 215a.

Figure 3:
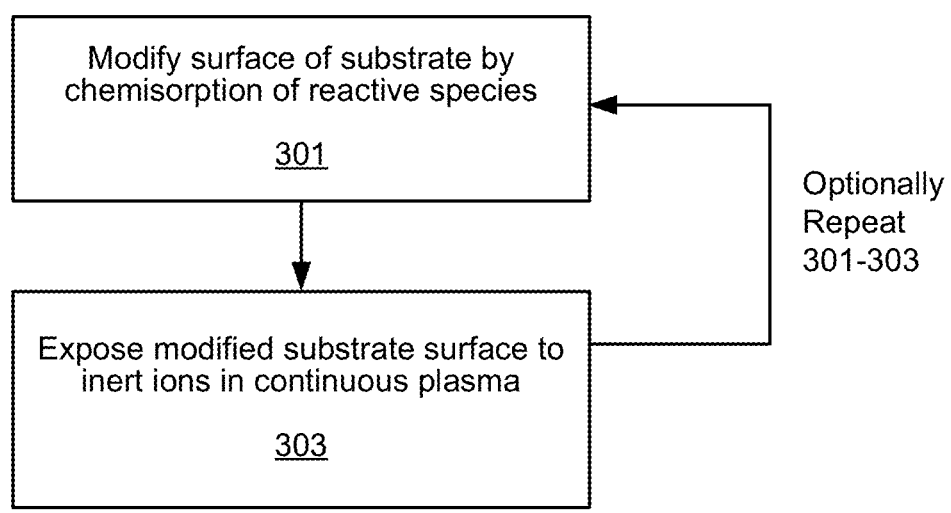
FIG. 3 is a process flow diagram depicting operations performed in accordance with certain disclosed embodiments.

Processes described herein may involve the following described operations, depicted for example in the process flow of FIG. 3. In one operation (301), a reactive species may be chemisorbed onto the surface of material to be etched on a substrate. The reactive species may constitute reactive radicals or other chemistry generated by a plasma and depends on the type of material being etched. Types of materials to be etched using disclosed embodiments include carbon-containing material, silicon-containing material, and metal-containing materials. One example of a carbon-containing material that may be etched using disclosed embodiments is amorphous carbon. Examples of silicon-containing materials that may be etched using disclosed embodiments include silicon, polysilicon, silicon-germanium, silicon oxide, silicon carbide, silicon-nitride, doped silicon carbide, doped silicon, and combinations thereof. Examples of metal-containing materials that may be etched using disclosed embodiments include elemental metals such as tungsten and titanium, metal oxides such as titanium oxide, and metal nitrides.

For example, for etching carbon-containing material, the reactive species may include an oxygen-containing plasma, fluorine-containing plasma, chlorine-containing plasma, bromine-containing plasma, or combinations thereof. Examples include $Cl_2$ and HBr. For example, in some embodiments, carbon-based materials may be etched using disclosed embodiments at a temperature less than about 50° C., such as about 20° C.

For etching a material that is primarily silicon, such as silicon-germanium or polysilicon, the reactive species may include fluorine-containing plasma, chlorine-containing plasma, bromine-containing plasma, or combinations thereof. Examples include $Cl_2$ and HBr. For etching silicon oxide, the reactive species may include fluorocarbons, such as $C_xF_y$, where x and y are integers, or $C_xH_yF_z$, where x, y, and z are integers selected depending on the material to be etched. For example, in some embodiments, silicon-based materials may be etched using disclosed embodiments at a temperature less than about 100° C., such as about 40° C.

In some embodiments, the reactive species may be used to etch a metal-based material on the substrate. For etching a material that is a metal oxide, such as titanium oxide, the reactive species may include halogen-containing plasma, such as fluorine-containing plasma, bromine-containing plasma, and chlorine-containing plasma. One example of etching metal oxide using a chlorine-containing plasma involves exposing the substrate to a gas, such as $Cl_2$, and igniting a plasma. Methods for etching metal oxides may be performed at a higher temperature than the temperature at which methods are performed for etching silicon-containing or carbon-containing materials. For example, in some embodiments, metal-based materials, e.g., metal oxides, may be etched using disclosed embodiments at a temperature greater than about 80° C., such as about 120° C. It will be understood that substrate temperature or temperature as referred to herein indicates the temperature at which a pedestal holding a substrate may be set.

The reactive species selected for chemisorbing onto the surface of the material to be etched does not spontaneously etch material on the substrate. In various embodiments, the reactive species is selected to also not etch any mask or pattern on the surface of the substrate. When an energized inert ion reaches the chemisorbed or modified layer, then the chemisorbed layer obtains enough energy to activate the surface and form a nonvolatile by-product, which may then be removed from a chamber where the substrate is housed during etching operations.

In some embodiments, while the substrate is exposed to the reactive species, the substrate is also exposed to inert ions (303). In various embodiments, the inert ions may be flowed to a chamber housing the substrate at a high concentration to dilute the presence of the reactive species and maintain a self-limiting etching process. Inert ions may have a high ionization rate. Examples include ions generated from He, Ne, Ar, Kr, Xe, or combinations thereof. In some embodiments, the ratio of inert ions to reactive species is controlled by operating at a high pressure, such as between about 30 mTorr and about 1000 mTorr. Operating at a high pressure ensures enough reactive molecules and radicals generated from the reactive species while suppressing overall ion density of the inert ions to prevent damage to the substrate from the inert ions. In various embodiments, a bias voltage is set such that the ion energy at which the inert ion would etch material is greater than the activation energy used to remove material of the chemisorbed layer, and while both energies are lower than the physical sputtering energy of the target material with inert ions, as described above with respect to FIG. 1.

Without being bound by a particular theory, it is believed that reactive species on the surface of the material to be etched may find a site and be absorbed by the surface up to a few atomic layers. The adsorbed layer does not have enough energy to overcome the surface energy (e.g., it will not be etched from the substrate) until an ion activates the local site. Once an inert ion activates the local site, the activated site forms a nonvolatile by-product, which may then diffuse into the chamber and be pumped out. However, if an ion reaches a surface that has no reactive chemicals absorbed, it would not have enough energy to physically sputter the substrate, and hence damage to the substrate is prevented. Etching may thus be performed in a continuous fashion, while still maintaining self-limited reactions to control the etching profile. During etching, the reactive ion density is maintained at a very low density (i.e. less than about 1% of the total ion density) and the plasma energy is also very low. The etch behavior may then be dominated by inert ions, allowing the inert ions to activate the modified surface and etch material as the surface becomes modified by the reactive species.

One advantage of the disclosed embodiments is that there is an increase in throughput efficiency because gases are flowed continuously without switching between gases (as is performed in cyclic ALE). Another advantage is that disclosed embodiments can be easily controlled by a few plasma parameters, such as bias voltage, plasma power, plasma frequency, gas flow rate and concentration, and chamber pressure. Disclosed embodiments generate a fast and well-controlled plasma which may be used to achieve low damage and high selectivity etching.

Furthermore, there are certain situations, like high aspect ratio etching, where radical diffusion becomes a major factor for the etch rate, aspect ratio dependence etching or through-pitch loading. For these applications, some embodiments may combine bias pulsing with higher pressure, and low reactive concentration plasma.

For example, for etching high aspect ratio features, the gas mixture in the etch chamber can be maintained with a low reactive ion concentration for chemisorption. Process conditions are controlled to ensure enough time for gas diffusion (which may range from µs to seconds). Bias voltage may be on only after diffusion time is enough to reach bottom of the high aspect ratio features to form a chemisorption layer. A short voltage pulse may be used to deliver ions to remove this layer, and diffusion-removal cycles may be repeated many times for high aspect ratio etching. Since according to the removal energy threshold techniques of this disclosure ion energy is low so that only the chemisorption layers can be removed by ions, while in conventional etch, reactive ion etching is dominant and usually a higher ion energy is desirable, performing the disclosed embodiments with bias pulsing results in a substantial improvement in selectivity, compared to conventional etching with high voltages.

The disclosed gas mixing concept can be extended to more complicated etching mechanisms and chemistries. For example, some $C_xF_y$ or $C_xH_yF_z$ etch chemistry or chemistry containing both etchant and deposition species will involve some activation energy to etch target material. High voltage with reactive ions is helpful for etch rate, but it also causes more damage to the substrate, reduces mask selectivity, and sometimes causes sidewall attack by ion scattering. However, inert ions with low energy can overcome some of the key challenges, because when the ion energy is below the sputtering threshold, no ion damage occurs. And if ion scattering happens, some energy is usually lost and may not be able to activate the sidewall surface anymore. Anisotropic etching using disclosed embodiments is possible with infinite selectivity to mask material. This can be applied to the core etch in double patterning applications, along with many other patterning and gate etch applications, such as fabrication of FinFET structures, logic gates, and 3D NAND structures.

Apparatus

Disclosed embodiments may be performed in any suitable etching chamber or apparatus, such as the Kiyo® FX, available from Lam Research Corporation of Fremont, Calif. In some embodiments, an inductively coupled plasma (ICP) reactor may be used. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference for the purpose of describing a suitable ICP reactor for implementation of the techniques described herein. Although ICP reactors are described herein, in some embodiments, it should be understood that capacitively coupled plasma reactors may also be used. An example etching chamber or apparatus may include a chamber having chamber walls, a chuck for holding a substrate or wafer to be processed which may include electrostatic electrodes for chucking and dechucking a wafer and may be electrically charged using an RF power supply, an RF power supply configured to supply power to a coil to generate a plasma, and gas flow inlets for inletting gases as described herein. In some embodiments, an apparatus may include more than one chamber, each of which may be used to etch, deposit, or process substrates. The chamber or apparatus may include a system controller for controlling some or all of the operations of the chamber or apparatus such as modulating the chamber pressure, inert gas flow, plasma power, plasma frequency, reactive gas flow (e.g., chlorine-containing gas, oxygen-containing gas, fluorine-containing gas, etc.); bias power, temperature, vacuum settings; and other process conditions.

Apparatus

Inductively coupled plasma (ICP) reactors which, in certain embodiments, may be suitable for atomic layer etching (ALE) operations are now described. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 4:
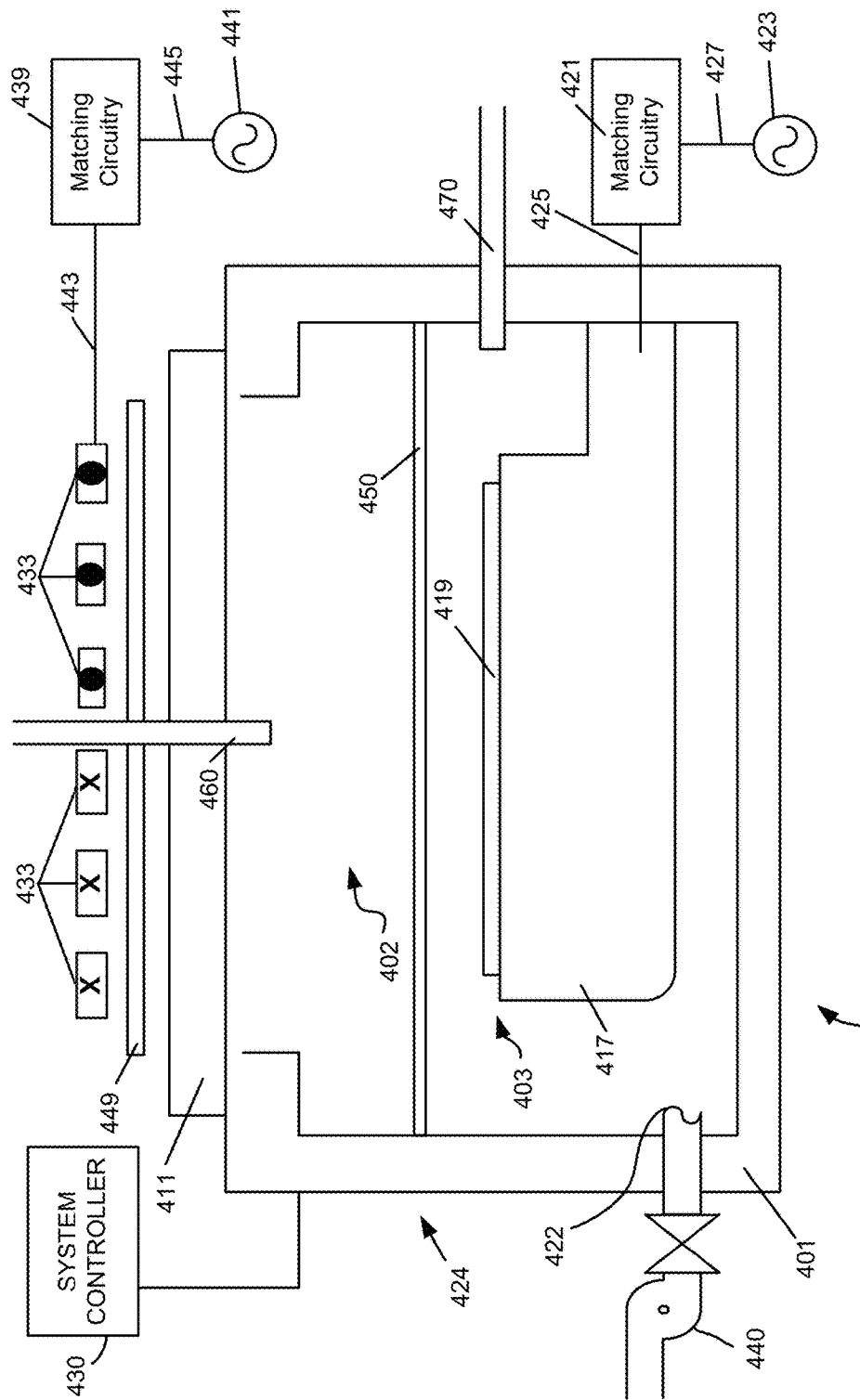
FIG. 4 is a schematic diagram of an example process etch chamber for performing certain disclosed embodiments.

FIG. 4 schematically shows a cross-sectional view of an inductively coupled plasma integrated etching and deposition apparatus 400 appropriate for implementing certain embodiments herein, an example of which is a Kiyo® reactor, produced by Lam Research Corp. of Fremont, Calif. The inductively coupled plasma apparatus 400 includes an overall process chamber 424 structurally defined by chamber walls 401 and a window 411. The chamber walls 401 may be fabricated from stainless steel or aluminum. The window 411 may be fabricated from quartz or other dielectric material. An optional internal plasma grid 450 divides the overall process chamber 424 into an upper sub-chamber 402 and a lower sub-chamber 403. In most embodiments, plasma grid 450 may be removed, thereby utilizing a chamber space made of sub-chambers 402 and 403. A chuck 417 is positioned within the lower sub-chamber 403 near the bottom inner surface. The chuck 417 is configured to receive and hold a semiconductor substrate or wafer 419 upon which the etching and deposition processes are performed. The chuck 417 can be an electrostatic chuck for supporting the wafer 419 when present. In some embodiments, an edge ring (not shown) surrounds chuck 417, and has an upper surface that is approximately planar with a top surface of the wafer 419, when present over chuck 417. The chuck 417 also includes electrostatic electrodes for chucking and dechucking the wafer 419. A filter and DC clamp power supply (not shown) may be provided for this purpose. Other control systems for lifting the wafer 419 off the chuck 417 can also be provided. The chuck 417 can be electrically charged using an RF power supply 423. The RF power supply 423 is connected to matching circuitry 421 through a connection 427. The matching circuitry 421 is connected to the chuck 417 through a connection 425. In this manner, the RF power supply 423 is connected to the chuck 417.

Elements for plasma generation include a coil 433 is positioned above window 411. In some embodiments, a coil is not used in disclosed embodiments. The coil 433 is fabricated from an electrically conductive material and includes at least one complete turn. The example of a coil 433 shown in FIG. 4 includes three turns. The cross-sections of coil 433 are shown with symbols, and coils having an "X" extend rotationally into the page, while coils having a "●" extend rotationally out of the page. Elements for plasma generation also include an RF power supply 441 configured to supply RF power to the coil 433. In general, the RF power supply 441 is connected to matching circuitry 439 through a connection 445. The matching circuitry 439 is connected to the coil 433 through a connection 443. In this manner, the RF power supply 441 is connected to the coil 433. An optional Faraday shield 449 is positioned between the coil 433 and the window 411. The Faraday shield 449 is maintained in a spaced apart relationship relative to the coil 433. The Faraday shield 449 is disposed immediately above the window 411. The coil 433, the Faraday shield 449, and the window 411 are each configured to be substantially parallel to one another. The Faraday shield 449 may prevent metal or other species from depositing on the window 411 of the process chamber 424.

Process gases (e.g. reactive species or precursors, reducing agents, carrier gases, halogen-containing gases, chlorine, inert gases, such as helium, argon, etc.) may be flowed into the process chamber through one or more main gas flow inlets 460 positioned in the upper sub-chamber 402 and/or through one or more side gas flow inlets 470. Likewise, though not explicitly shown, similar gas flow inlets may be used to supply process gases to a capacitively coupled plasma processing chamber. A vacuum pump 440, e.g., a one or two stage mechanical dry pump and/or turbomolecular pump, may be used to draw process gases out of the process chamber 424 and to maintain a pressure within the process chamber 424. For example, the vacuum pump 440 may be used to evacuate the lower sub-chamber 403 during a purge operation of ALE. A valve-controlled conduit may be used to fluidically connect the vacuum pump to the process chamber 424 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 400, one or more process gases may be supplied through the gas flow inlets 460 and/or 470. In certain embodiments, process gas may be supplied only through the main gas flow inlet 460, or only through the side gas flow inlet 470. In some cases, the gas flow inlets shown in the figure may be replaced by more complex gas flow inlets, one or more showerheads, for example. The Faraday shield 449 and/or optional grid 450 may include internal channels and holes that allow delivery of process gases to the process chamber 424. Either or both of Faraday shield 449 and optional grid 450 may serve as a showerhead for delivery of process gases. In some embodiments, a liquid vaporization and delivery system may be situated upstream of the process chamber 424, such that once a liquid reactant or precursor is vaporized, the vaporized reactant or precursor is introduced into the process chamber 424 via a gas flow inlet 460 and/or 470.

Radio frequency power is supplied from the RF power supply 441 to the coil 433 to cause an RF current to flow through the coil 433. The RF current flowing through the coil 433 generates an electromagnetic field about the coil 433. The electromagnetic field generates an inductive current within the upper sub-chamber 402. The physical and chemical interactions of various generated ions and radicals with the wafer 419 etch features of and deposit layers on the wafer 419.

Volatile etching and/or deposition byproducts may be removed from the lower sub-chamber 403 through port 422. The chuck 417 disclosed herein may operate at elevated temperatures ranging between about 10° C. and about 250° C. The temperature will depend on the process operation and specific recipe.

Apparatus 400 may be coupled to facilities (not shown) when installed in a clean room or a fabrication facility. Facilities include plumbing that provide processing gases, vacuum, temperature control, and environmental particle control. These facilities are coupled to apparatus 400, when installed in the target fabrication facility. Additionally, apparatus 400 may be coupled to a transfer chamber that allows robotics to transfer semiconductor wafers into and out of apparatus 400 using typical automation.

In some embodiments, a system controller 430 (which may include one or more physical or logical controllers) controls some or all of the operations of a process chamber 424. The system controller 430 may include one or more memory devices and one or more processors. For example, the memory may include instructions to alternate between flows of modification chemistry such as a chlorine-containing modification chemistry and a removal gas such as argon, or instructions to ignite a plasma or apply a bias. For example, the memory may include instructions to set the bias at a power between about 0V and about 200V during some operations. In some embodiments, the apparatus 400 includes a switching system for controlling flow rates and durations when disclosed embodiments are performed. In some embodiments, the apparatus 400 may have a switching time of up to about 500 ms, or up to about 750 ms. Switching time may depend on the flow chemistry, recipe chosen, reactor architecture, and other factors.

In some embodiments, disclosed embodiments can be integrated on a MSSD (Multi-Station-Sequential-Deposition) chamber architecture in which one of deposition stations can be replaced by an ALE station to allow an integrated deposition/etch/deposition process using a similar chemistry for better fill and faster throughput capability.

In some implementations, the system controller 430 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 430, which may control various components or subparts of the system or systems. The system controller 430, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 430 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 430, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 430 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 430 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 5:
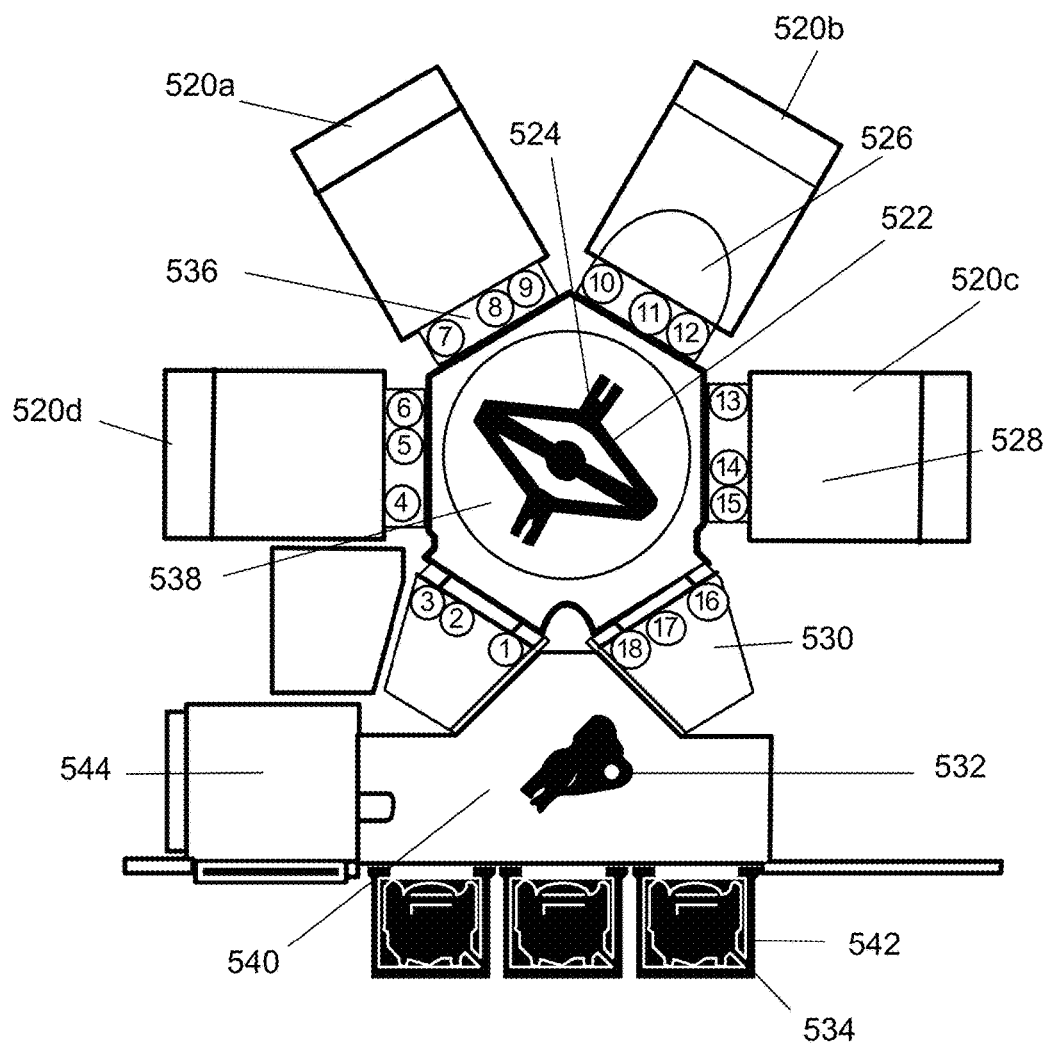
FIG. 5 is a schematic diagram of an example process apparatus for performing certain disclosed embodiments.

FIG. 5 depicts a semiconductor process cluster architecture with various modules that interface with a vacuum transfer module 538 (VTM). The arrangement of transfer modules to "transfer" wafers among multiple storage facilities and processing modules may be referred to as a "cluster tool architecture" system. Airlock 530, also known as a loadlock or transfer module, is shown in VTM 538 with four processing modules 520*a*-520*d*, which may be individual optimized to perform various fabrication processes. By way of example, processing modules 520*a*-520*d* may be implemented to perform substrate etching, deposition, ion implantation, wafer cleaning, sputtering, and/or other semiconductor processes. In some embodiments in accordance with this disclosure, modification by reactive species and exposure to inert ions for material etch and removal are performed in the same module. Airlock 530 and process module 520 may be referred to as "stations." Each station has a facet 536 that interfaces the station to VTM 538. Inside each facet, sensors 1-18 are used to detect the passing of wafer 526 when moved between respective stations.

Robot 522 transfers wafer 526 between stations. In one embodiment, robot 522 has one arm, and in another embodiment, robot 522 has two arms, where each arm has an end effector 524 to pick wafers such as wafer 526 for transport. Front-end robot 532, in atmospheric transfer module (ATM) 540, is used to transfer wafers 526 from cassette or Front Opening Unified Pod (FOUP) 534 in Load Port Module (LPM) 542 to airlock 530. Module center 528 inside process module 520 is one location for placing wafer 526. Aligner 544 in ATM 540 is used to align wafers.

In an exemplary processing method, a wafer is placed in one of the FOUPs 534 in the LPM 542. Front-end robot 532 transfers the wafer from the FOUP 534 to an aligner 544, which allows the wafer 526 to be properly centered before it is etched or processed. After being aligned, the wafer 526 is moved by the front-end robot 532 into an airlock 530. Because airlock modules have the ability to match the environment between an ATM and a VTM, the wafer 526 is able to move between the two pressure environments without being damaged. From the airlock module 530, the wafer 526 is moved by robot 522 through VTM 538 and into one of the process modules 520a-520d. In order to achieve this wafer movement, the robot 522 uses end effectors 524 on each of its arms. Once the wafer 526 has been processed, it is moved by robot 522 from the process modules 520a-520d to an airlock module 530. From here, the wafer 526 may be moved by the front-end robot 532 to one of the FOUPs 534 or to the aligner 544.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 4 may be implemented with the tool in FIG. 5.

EXPERIMENTAL

Experiment 1

Figure 6:
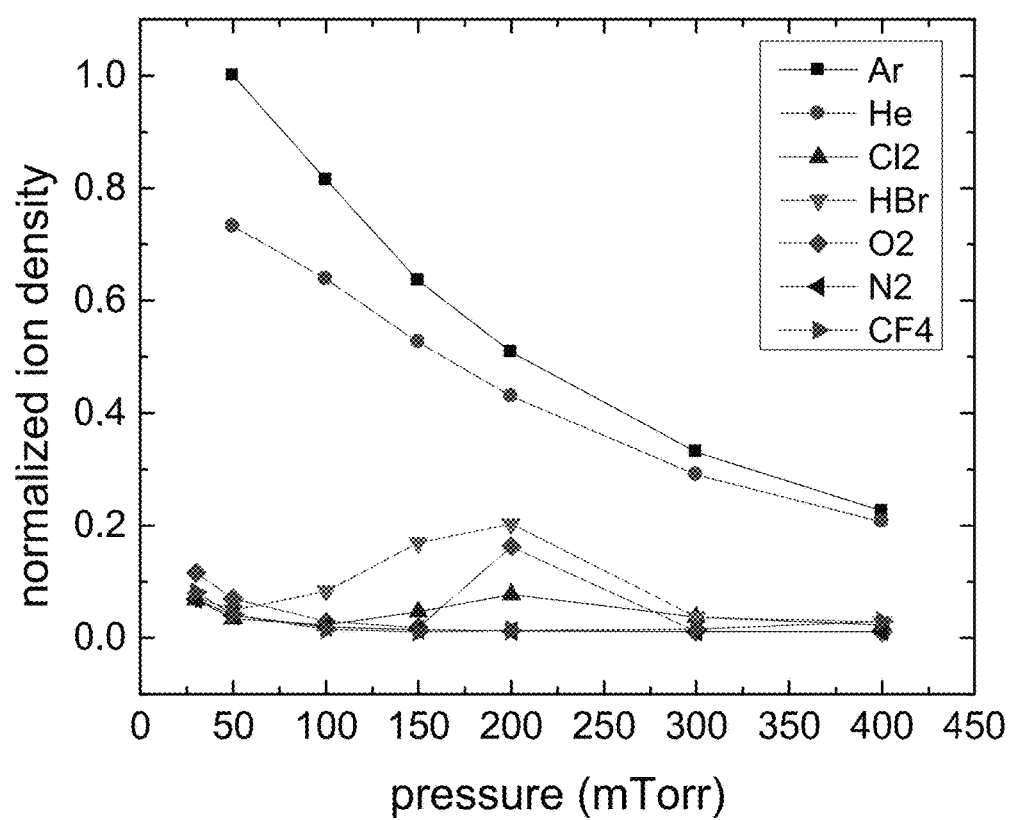
FIG. 6 shows a plot of reference data of ion density and pressure for various inert gases relevant to a discussion of atomic layer etching according to this disclosure.

FIG. 6 shows a plot of reference data of ion density and pressure for various inert gases. Data was obtained by flowing the gases at different pressures into an etch tool with a simple inert or reactive gas. Normalized ion density vs pressure for 200 sccm flow of Ar, He, $Cl_2$, HBr, $O_2$, $N_2$ and $CF_4$, with a plasma power of 1500 W is shown. As indicated in the Figure, the ion density decreases with higher pressure for many gases, and Ar or He generates much higher ion density than other molecular gases.

Experiment 2

An experiment was conducted on a substrate including an underlayer and a target carbon-containing layer with an overlying mask. The substrate was housed in a chamber having a chamber pressure of 200 mTorr. The substrate was exposed for 30 seconds to a plasma generated using an inductively coupled plasma power set at 1500 W using 1500 sccm helium and 5 sccm $O_2$ at a temperature of 20° C. while applying a bias of 50Vb. The process etched 35.73 nm of the carbon layer, and the etched carbon-containing target layer had substantially vertical sidewalls. Additionally, the mask maintained a good profile without mask loss such that the sidewalls of the mask remained vertical.

Experiment 3

An experiment was conducted on a substrate including titanium oxide spacers in a carbon-containing layer over a substrate. The substrate was housed in a chamber having a chamber pressure of 200 mTorr. The substrate was exposed for 100 seconds to a plasma generated using an inductively coupled plasma power set at 1500 W using a 1500 sccm helium and 10 sccm $Cl_2$ mixture at a temperature of 120° C. while applying a bias of 50Vb. Titanium oxide spacers were anisotropically etched in this process and the resulting substrate maintained a good profile without mask loss or sidewall etching such that the sidewalls of the mask remained vertical and no undercut was observed.

Experiment 4

An experiment was conducted on a silicon-based substrate with an overlying photoresist mask. The substrate was housed in a chamber having a chamber pressure of 250 mTorr. The substrate was exposed for 10 seconds to a plasma generated using an inductively coupled plasma power set at 1000 W using 1500 sccm helium and 20 sccm $CF_4$ at a temperature of 40° C. while applying a bias of 50Vb. Features in the substrate were anisotropically etched in this process and the resulting substrate maintained a good profile without sidewall etching such that the sidewalls of the etched features and mask remained vertical and no undercut was observed.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of etching a material of a substrate, the method comprising:
exposing a substrate in a processing chamber to a plasma-generated reactive species, and while the substrate is exposed to the plasma-generated reactive species, also exposing the substrate to plasma-generated inert ions to remove a material exposed on the substrate using self-limiting reactions,
wherein an energy threshold for removing a layer of the material modified by the reactive species using the inert ions is less than an energy threshold for sputtering the material exposed on the substrate using the inert ions.

2. The method of claim 1, wherein exposure of the substrate to the reactive species modifies the exposed material of the substrate, and the inert ions generated by the plasma remove the modified substrate material, thereby etching the material of the substrate.

3. The method of claim 1, wherein, during the exposure of the substrate to the reactive species and inert ions, the plasma is delivered continuously such that both source power and bias power are continuously on while etching the material of the substrate.

4. The method of claim 3, wherein the concentration of the inert ions present in the processing chamber during the etch is greater than 99% of all chemical species in the chamber, while the concentration of reactive species is less than about 1%.

5. The method of claim 1, further wherein a mask layer overlies the material of the substrate to be etched, and the energy threshold for removing a layer of the material modified by the reactive species using the inert ions is less than the energy threshold upon which the inert ions have sufficient energy to bombard or sputter onto the surface of a mask layer over the target layer, thereby resulting in physical removal of mask material.

6. The method of claim 1, wherein processing chamber pressure is between about 30 mTorr and about 1000 mTorr.

7. The method of claim 6, wherein processing chamber pressure is between about 100 mTorr and about 500 mTorr.

8. The method of claim 7, wherein processing chamber pressure is between about 200 mTorr and about 300 mTorr.

9. The method of claim 1, wherein the ion density of reactive ions, that are reactive to etch unmodified material on the substrate, is negligible.

10. The method of claim 1, wherein the material of a substrate to be etched is carbon-based.

11. The method of claim 10, wherein the carbon-containing material to be etched is amorphous carbon.

12. The method of claim 11, wherein the reactive species includes species selected from the group consisting of an oxygen-containing plasma, fluorine-containing plasma, chlorine-containing plasma, bromine-containing plasma, or combinations thereof.

13. The method of claim 1, wherein the material of a substrate to be etched is silicon-based.

14. The method of claim 13, wherein the silicon-containing material to be etched is selected from the group consisting of silicon, polysilicon, silicon-germanium, silicon oxide, silicon carbide, silicon-nitride, doped silicon carbide, doped silicon, and combinations thereof.

15. The method of claim 14, wherein the reactive species includes species selected from the group consisting of a fluorine-containing plasma, chlorine-containing plasma, bromine-containing plasma, or combinations thereof.

16. The method of claim 1, wherein the material of a substrate to be etched is metal-based.

17. The method of claim 16, wherein the metal-containing material to be etched is selected from the group consisting elemental metals tungsten and titanium, metal oxide, titanium oxide, metal nitrides, and combinations thereof.

18. The method of claim 17, wherein the reactive species includes species selected from the group consisting of a fluorine-containing plasma, chlorine-containing plasma, bromine-containing plasma, or combinations thereof.

19. The method of claim 1, wherein the inert ions include ions generated from He, Ne, Ar, Kr, Xe, or combinations thereof.

* * * * *